United States Patent [19]

Nakagawa

[11] Patent Number: 5,724,277
[45] Date of Patent: Mar. 3, 1998

[54] BACKGROUND NOISE GENERATING APPARATUS

[75] Inventor: Masashi Nakagawa, Tokyo, Japan

[73] Assignee: NEC Corporation, Tokyo, Japan

[21] Appl. No.: 568,233

[22] Filed: Dec. 6, 1995

[30] Foreign Application Priority Data

Dec. 6, 1994 [JP] Japan ................................. 6-301943

[51] Int. Cl.$^6$ .................................................. G06F 1/02
[52] U.S. Cl. .................................................. 364/124.17
[58] Field of Search ........................ 364/717, 715.5; 331/78

[56] References Cited

U.S. PATENT DOCUMENTS 5,121,349 6/1992 Naito ........................................ 364/717
5,570,307 10/1996 Takahashi ................................. 364/717

*Primary Examiner*—David H. Malzahn
*Attorney, Agent, or Firm*—Whitham, Curtis, Whitham & McGinn

[57] ABSTRACT

An object of the invention is to provide a background noise generating circuit having a small circuit scale and a small power consumption and capable of setting an arbitrary gain for the background noise. For each frame clock, a circuit (6, 5) generates a gain setting code signal S5 in synchronism with a data clock, and a random generator 21 generates a random number S21 in synchronism with a frame clock FCK. For a period of each frame, a logic gate 22 generates an exclusive-OR between the gain setting code signal S5 and the random number S21, the exclusive-OR constituting a background noise signal S9, which is supplied to a signal processing circuit 7 through a selection circuit 4 during a background noise period. Th gain setting code signal S5 may be determined by detecting the level of a received signal during a received signal input period just before the background noise period, and the gain setting code signal S5 thus determined is held during the background noise period and continues to be supplied to the logic gate.

7 Claims, 8 Drawing Sheets

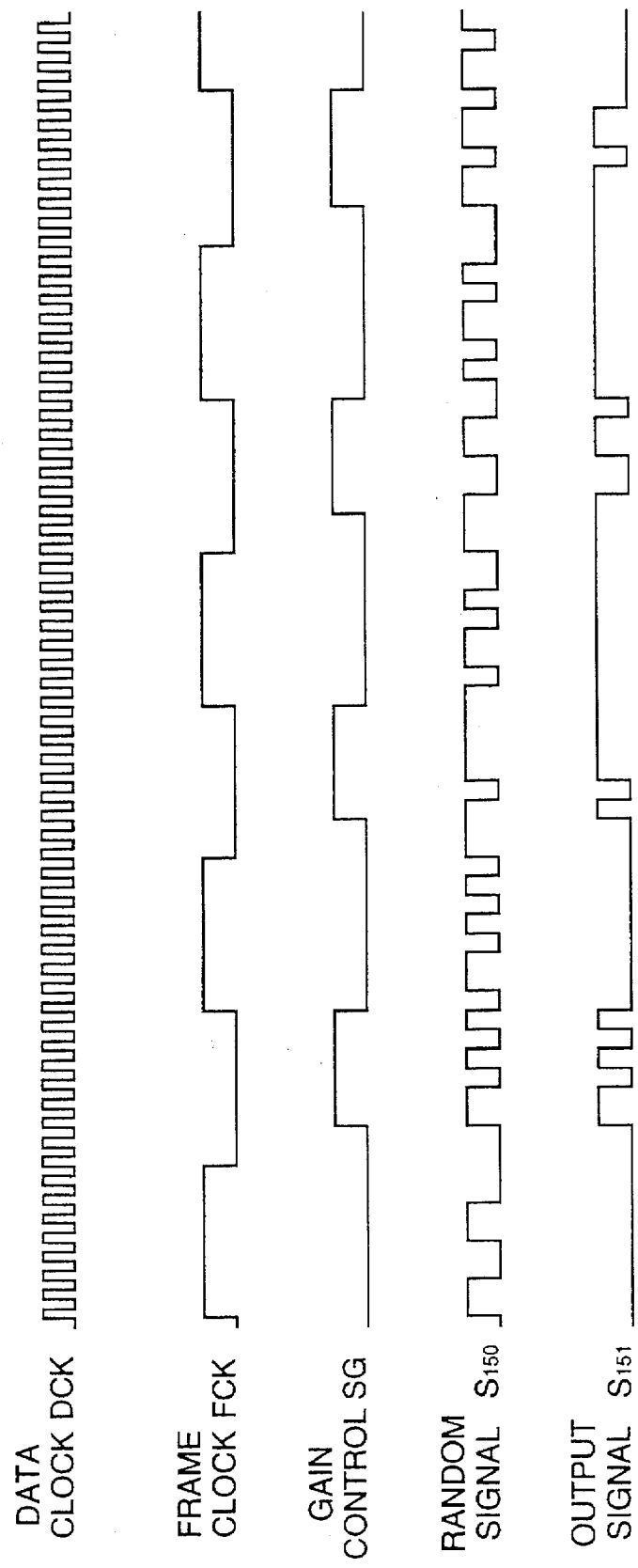

FIGURE 6
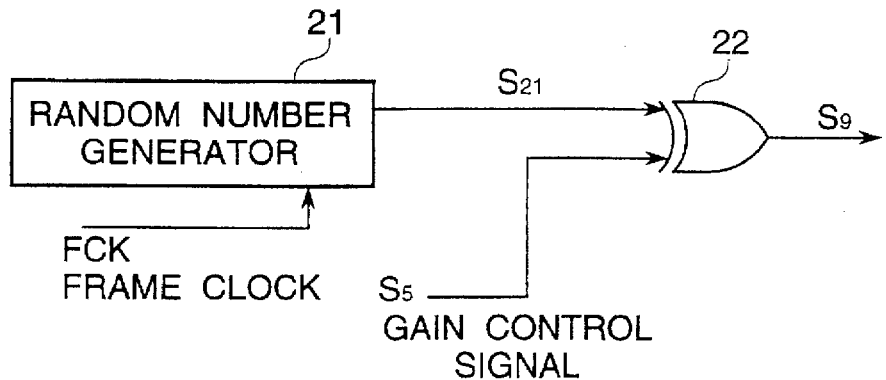
FIGURE 8
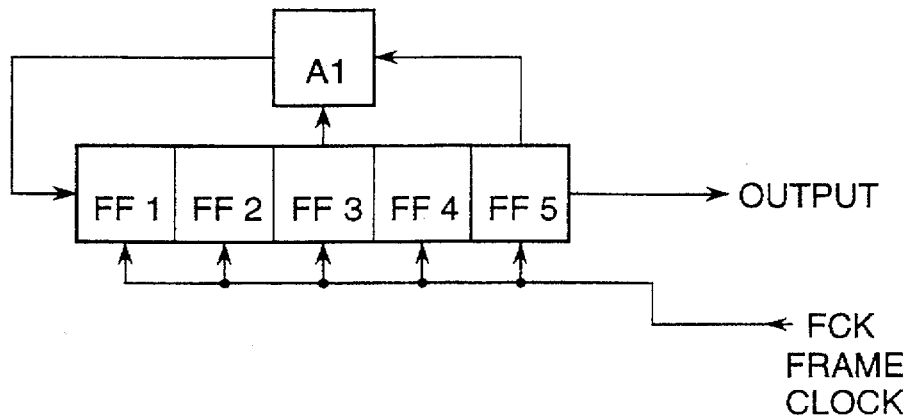
FIGURE 9
```
DECIMAL   BINARY
NUMBER    NUMBER
   :         :
   4    :  "0 ······ 0 1 0 0"
   3    :  "0 ······ 0 0 1 1"
   2    :  "0 ······ 0 0 1 0"
   1    :  "0 ······ 0 0 0 1"
   0    :  "0 ······ 0 0 0 0"
  -1    :  "1 ······ 1 1 1 1"
  -2    :  "1 ······ 1 1 1 0"
  -3    :  "1 ······ 1 1 0 1"
  -4    :  "1 ······ 1 1 0 0"
  -5    :  "1 ······ 1 0 1 1"
   :         :
```

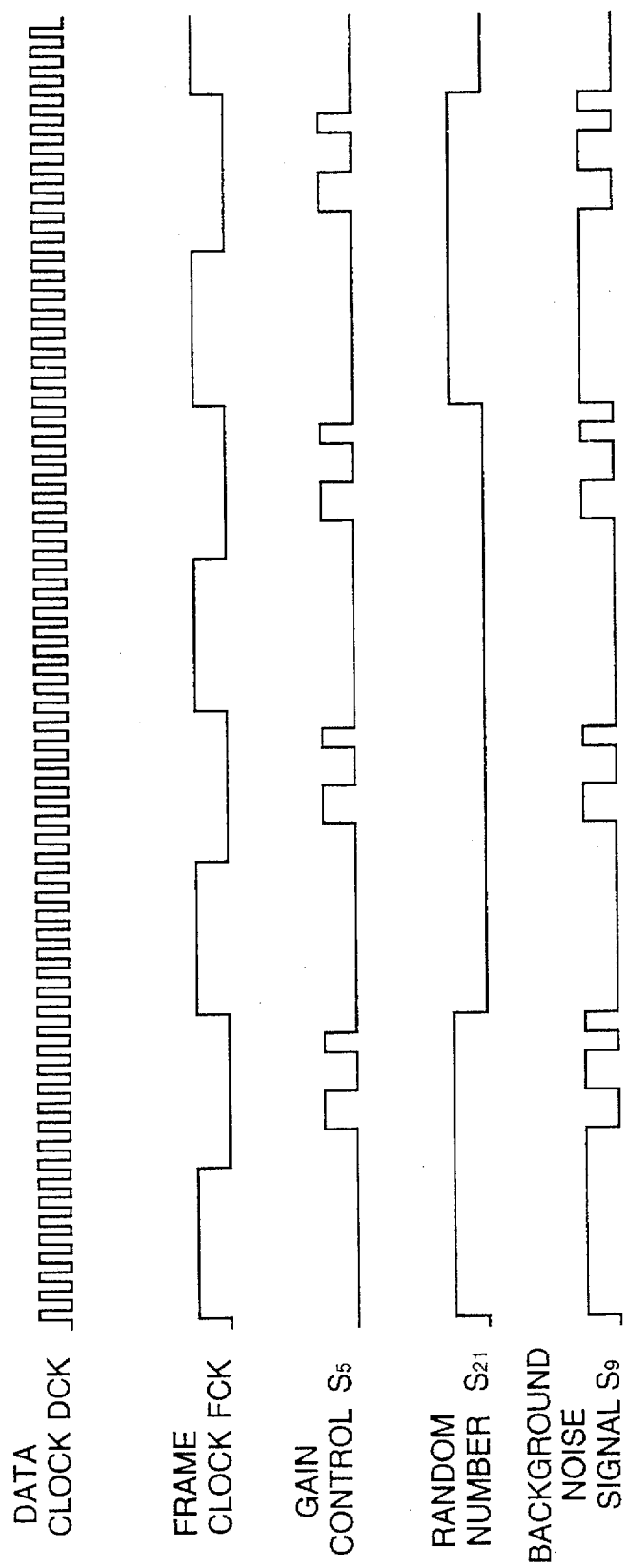

BACKGROUND NOISE GENERATING APPARATUS

BACKGROUND OF THE INVENTION

1. Field of the Invention

The present invention relates to a background noise generating apparatus, and more specifically to a background noise generating apparatus capable of controlling the gain of background noise.

2. Description of Related Art

In a communication system, generation of various noise including noise attributable to external factors on a transmission channel and quantization noise in transmitting/receiving signals is inevitable. Accordingly, it is necessary to remove the noise to the maximum possible extent, for example, in case of transmitting digital information such as digital data for computers. On the other hand, in the case of transmitting information such as an image or an audio sound which is originally analog data, noise accompanied by the transmission will deteriorate quality of a received image or audio sound at some degree. However, if the noise is partially removed by any artificial data processing, it may rather result in the fact that unnatural processing has been made to information to be transmitted.

For example, one of conventional transmission systems has been such that, in case of transmitting an image or an audio sound, in a period during which a white or a black continues or a soundless condition or no-sound continues, information meaning that the white or the no-sound continues is transmitted in place of transmitting the image or the audio as a transmission data, and on the other hand, at a receiving side, a white period or a no-sound period is reproduced on the basis of the received information. In this method, for example, in the case of the audio, during a period in which an audio data to be transmitted exists, the audio data is converted in accordance with a predetermined digital encoding system into a transmission data, which is then transmitted to a receiving side. At the receiving side, the transmitted data is received together with noise, and the audio data having an audio quality deteriorated because of the included noise (such as noise generated in the transmission channel or quantization noise included in the transmitted data) is reproduced on the basis of the received data. During a period in which an audio data to be transmitted does not exist, namely, during a no-sound period, information indicative of no-sound is transmitted as a digital data. At the receiving side, the transmitted information indicative of no-sound is received together with noise. However, the no-sound indicating information, which is digital data, can be transmitted at a high degree of reliability by using a conventional error correction code, and therefore, the receiving side can receive this no-sound indicating information without being subjected to influence of the noise, so that the no-sound period is reproduced on the basis of the no-sound indicating information.

Accordingly, in an audio sound finally reproduced in accordance with the received data, if the no-sound period starts, not only the audio data becomes broken, but also the noise having uniformly existed in a background of the audio data disappears. Namely, a complete no-sound condition occurs. This results in that an extremely unnatural data processing has been applied to an audio data which is an analog data.

Similarly, in an image transmission, when an image is reproduced at a receiving side, for example, in an area where a uniform color continues, there is obtained a high quality image having neither color deterioration nor color irregularity, which can be said to be unbalanced in comparison with the other area. As a result, the overall image reproduced gives an impression that the image quality is rather deteriorated.

In order to prevent the above mentioned problem, the conventional communication system includes therein a background noise generating mean for generating a false or artificial noise, which is provided in a receiver.

Referring to FIG. 1, there is shown one example of the conventional noise generating circuit. FIG. 2 is a timing chart illustrating an operation of the conventional noise generating circuit shown in FIG. 1. In addition, a background noise generated by the shown conventional noise generating circuit is supplied to a not-shown selection circuit, which also receives a received signal, and alternatively selects either the received signal or the background noise generated by the circuit shown in FIG. 1, in accordance with a control signal (not shown) for each frame. An output of the not-shown selection circuit is supplied to a received signal processing circuit (not shown) including for example a filter circuit, a D/A (digital to analog) converting circuit, and an amplifying circuit (all of which are also not shown).

Referring to FIG. 1, an artificial random number generator 150 receives a data clock DCK and generates an artificial random number signal S150 taking at random and independently either a value "0" or a value "1" for each one period of the data clock DCK. A delay circuit 152 receives an output of the artificial random number generator 150 and outputs a signal delayed by a time shorter than the period of the data clock DCK. A latch circuit 153 latches an output of the delay circuit 152 in synchronism with a rising of a gain control signal SG. Namely, the latch circuit 153 latches the output of the artificial random number generator 150 in a period of the data clock DCK just before the rising timing of the gain control signal SG.

This gain control signal SG is a signal constituted by serially outputting a code indicative of the gain $2^{-n}$ from the least significant bit in the order, in synchronism with the data clock DCK, as will be explained hereinafter. In the shown example, however, the gain $2^{-10}$ is set as one example. Namely, the gain control signal SG indicates the code "0000000000111111" in each one frame as shown in FIG. 2.

A selector 151 receives the output of the artificial random number generator 150 and an output of the latch circuit 153, and is controlled by the gain control signal SG to select, as an output signal S151, the output of the artificial random number generator 150 when the gain control signal SG is at a high level and the output of the latch circuit 153 when the gain control signal SG is at a low level. Therefore, when the gain control signal SG is maintained at the low level, the selector 151 continues to supply the output of the delay circuit latched at the rising of the gain control signal SG before the gain control signal SG is brought to the low level. On the other hand, when the gain control signal SG is maintained at the high level, the selector 151 continues to supply the output of the artificial random number generator 150 without modification.

In the shown example, therefore, of a 16-bit data of the output signal appearing during each one frame, all of the most significant 10 bits are brought to either "1" or "0" with probability of ½, but the least significant 6 bits have a random bit structure. When all 15 bits of the gain control signal SG excluding the most significant bit (MSB) indicate "1", the absolute value of the random bit, namely, the noise, becomes maximum. Therefore, in the value of the output signal composed of the serial code, the sign code (of plus or minus) is determined for each one frame, and the absolute value is determined at random in the range of not greater than $2^6/2^{15}=2^{-9}$. Since the absolute value is determined at random in the range of not greater than $2^{-9}$, an averaged value of this absolute value becomes about $2^{-9} \times (½) = 2^{-10}$.

Namely, the output of the selector 151 becomes a code indicative of a random noise having a gain of $2^{-10}$.

Accordingly, the above mentioned noise generating circuit can be said to have a constitution of generating a random number having a predetermined gain, by selecting either the sign bit or the artificial random number, and when the sign bit is selected, by expanding the sign bit by a predetermined digit number so as to restrict a real number part.

Incidentally, in order to adjust the gain, the above mentioned construction may be added with a function of shifting the random number data generated by the random number generator, to a digit position indicating a predetermined gain, so that the shifted data constitutes the background noise data. In other words, for example, a first bit of the generated random number data is maintained and continues to be outputted, and on the other hand, second and succeeding bits are held and then outputted after those bits are shifted in timing until a predetermined digit position, so that a signal similar to a background noise output signal as shown in FIG. 2 can be obtained. Alternatively, another approach may be considered to copy the first bit of the random number by a predetermined number of digits, and to put the second and succeeding bits at a position following the predetermined number of digits, so that an output data is previously prepared. The data thus prepared is outputted in synchronism with the data clock.

However, these approaches need a special circuit including for example a latch for holding a plurality of bits of the random number, a counter for determining an output timing, and a shift register for shifting the random number. Therefore, since the above mentioned approaches make the circuit size large, a circuit shown in FIG. 1 is used.

In the above mentioned background noise generating apparatus, however, as will be apparent from the above description, it is possible to set only the gain of $2^{-n}$, where "n" is a natural number. In other words, in the above mentioned background noise generating apparatus, rather than to say that the gain control signal SG is used as a binary code directly indicating the value of the gain, it can be said that the gain control signal SG is used as a modification signal for doubling or halving the absolute value of the background noise in units of powers of "2", by masking some significant bits of the random number data.

Under this circumstance, in order to set a gain other than the gain of $2^{-n}$, it is possible to adopt an improved circuit construction as shown in FIG. 3. In the circuit construction shown in FIG. 3, a random number data signal SD generated by the random number generator 150 is supplied to three-cascaded flipflops 51, 52 and 53, which are driven with a shift clock 55 so as to sequentially shift the random data. The random number data signal SD generated by the random number generator 150 and output signals S51 and S53 outputted from the flipflops 51 and 53 are shown in FIG. 4. In FIG. 4, respective data bits are indicated by A1, A2, ... in the order of outputting. Therefore, data bits shown at a left side of FIG. 4 precede in time. Each frame is constituted of 8 bits, and a last bit SA, namely, the MSB bit, is a sign bit. As seen from FIG. 4, the output signal S51 of the flipflop 51 is delayed from the random number output signal SD by one bit, and the output signal S53 of the flipflop 53 is delayed from the random number output signal SD by three bits. These signals SD, S51 and S53 are serially outputted in the order starting from the LSB bit for each one frame, and therefore, the signals S51 and S53 are delayed in time from the signal SD by the one bit and the three bits, respectively. Accordingly, the value indicated by the signals S51 and S53 correspond to $2^{-1}$-timed and $2^{-3}$-timed values of the value indicated by the signal SD, respectively.

The output signals S51 and S53 of the flipflops 51 and 53 are supplied to one input of AND gates 58 and 59, respectively. These AND gates 58 and 59 receive mask signals A 56 and B 57 at the other input thereof, respectively. Thus, the output signals S51 and S53 are outputted through the AND gates 58 and 59 during a period in which a corresponding one of the mask signals A 56 and B 57 is a high level. As shown in FIG. 4, output signals S58 and S59 of the AND gates 58 and 59 are signals obtained by delaying the random number signal SD by the timing determined by the number of the flipflops, and further extracting from the delayed random number signals only bits on the bit positions determined by the corresponding mask signal. The mask signals A 56 and B 57 prevent, data included in the signals S51 and S53 but belonging to different frames, from being outputted to an adder of a next stage, in the form overlapping to each other in time.

In the circuit shown in FIG. 3, the signals S51 and S53 are added by an adder 60, which has a delayed operating timing corresponding to a delay time until the signals S51 and S53 are actually outputted. In the timing chart shown in FIG. 4, a frame timing in which the adder 60 operates, is indicated by "T".

Here, assume that the value indicated by the random number signal SD of one frame is "D" and values represented by the signals S58 and S59 in one frame timing T are "X" and "Y", respectively. Since X=D/8 and Y=D/2 as mentioned above, X+Y=D×0.625. Namely, the background noise signal outputted from the adder 60 has the gain of 0.625.

This gain is flexibility set by changing the number of the flipflops 51, etc., and the positions of the cascaded flipflops from which the delayed signal is extracted for addition (in the above mentioned example, the first stage and the third stage). Thus, the background noise generating apparatus incorporating therein the above mentioned circuit, can freely set the gain.

As mentioned above, the background noise generating apparatus shown in FIG. 1 can set only the gain of $2^{-n}$. If the background noise generating apparatus shown in FIG. 1 is modified to set a plurality of gains, since the circuit for delaying the random number signal and the latch circuit are required, the circuit size becomes large and the consumed electric power increases.

In the improved background noise generating apparatus shown in FIG. 3, the value of the gain can be set freely. However, the number of the required flipflops increases with precision of the gain which is set, so that the circuit becomes extremely large.

In the circuit shown in FIG. 3, for example, if it is attempted to designate the gain setting coefficient $2^{-1}+2^{-3}=$ 0.625 in the above mentioned example) with a higher precision, namely, with a large effective digit number, it is necessary to obtain a sum after coefficients $2^{-4}$ and $2^{-5}$ are generated. This means that the number of associated flipflops becomes four or five. The higher the precision of the value of the gain set is, the larger the number of the positions of the cascaded flipflops from which the data is extracted for addition, becomes, and the larger the number of the masking AND circuits also becomes. In addition, it is inevitable to scale up the adder, since the adder receives an increased number of input signals. Furthermore, if the number of the masking AND circuits increases, a circuit for generating mask signals to be supplied to the increased number of masking AND circuits, becomes complicated and large in size.

SUMMARY OF THE INVENTION

Accordingly, it is an object of the present invention to provide a background noise generating apparatus which has overcome the above mentioned defects of the conventional ones.

Another object of the present invention is to provide a background noise generating apparatus so configured as to easily and freely set the gain with a data bit precision and capable of greatly reducing the circuit construction for setting any gain other than powers of "2".

The above and other objects of the present invention are achieved in accordance with the present invention by a background noise generating apparatus comprising a first input circuit receiving a level control information, a level control circuit receiving an output of the first input circuit and controlled by a first clock so as to output a level control signal in accordance with the output of the first input circuit, a random number generator receiving a second clock different from the first clock, for generating a random data, a logic gate receiving the random data and the level control signal during a first period in accordance with the second clock, for generating a predetermined logic value signal, a selection controller receiving the second clock, for outputting a predetermined selection control signal in synchronism with the second clock, and a selection circuit receiving an output of the logic gate, for selectively supplying the output of the logic gate during the first period in accordance with the selection control signal from the selection controller.

In one embodiment of the background noise generating apparatus in accordance with the present invention, the first clock has a period shorter than that of the second clock.

In addition, the background noise generating apparatus in accordance with the present invention further includes a second input circuit receiving a predetermined input signal in response to the first clock, and a signal processing circuit receiving an output signal outputted from the selection circuit. The selection circuit also receives an output signal outputted from the second input circuit, and is controlled in accordance with the selection control signal, so as to selectively supply the output signal outputted from the second input circuit, to the signal processing circuit during a second period different from the first period.

Furthermore, the output of the second input circuit is serially outputted in response to the first clock, and the level control signal of the level control circuit is also serially outputted in response to the first clock. On the other hand, the random data of the random number generator is serially outputted in response to the second clock.

In a specific embodiment, the level control circuit can include a detection circuit connected to the output of the selection circuit and for detecting the level of the output signal of the selection circuit during the second period, so as to generate the level control signal in accordance with the detected level of the output signal of the selection circuit. The level control signal is supplied to the first input circuit. The level control circuit also includes a level control signal generating circuit for generating the level control signal in accordance with the output of the first input signal, and a holding circuit for holding and outputting the level control signal generated in the level control signal generating circuit, during the first period in accordance with the second clock.

The above and other objects, features and advantages of the present invention will be apparent from the following description of preferred embodiments of the invention with reference to the accompanying drawings.

BRIEF DESCRIPTION OF THE DRAWINGS

FIG. 2 is a timing chart illustrating an operation of the conventional example shown in FIG. 1;

FIG. 6 is a logic circuit diagram of the noise generator of the first embodiment shown in FIG. 5;

FIG. 7 is a timing chart illustrating an operation of the noise generator shown in FIG. 6, FIG. 8 is a logic circuit diagram illustrating the construction of a random number generator;

FIG. 9 illustrates a binary code used in the background noise generating apparatus;

DESCRIPTION OF THE PREFERRED EMBODIMENTS

Figure 1:
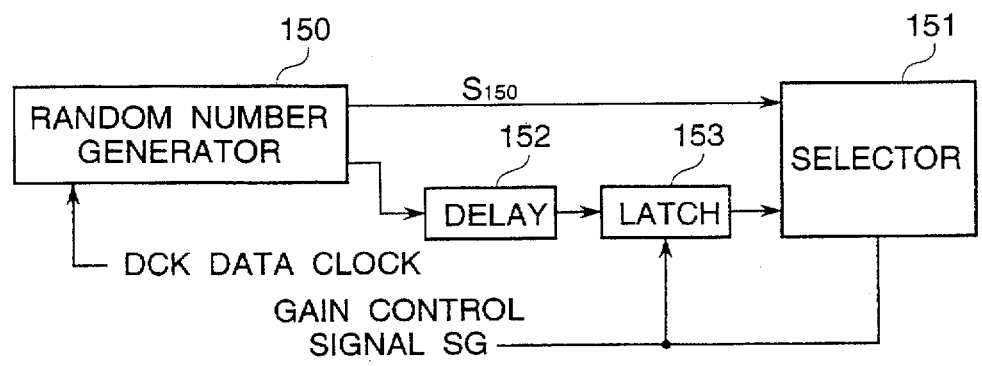
FIG. 1 is a block diagram of a conventional example of the background noise generating apparatus.
Figure 3:
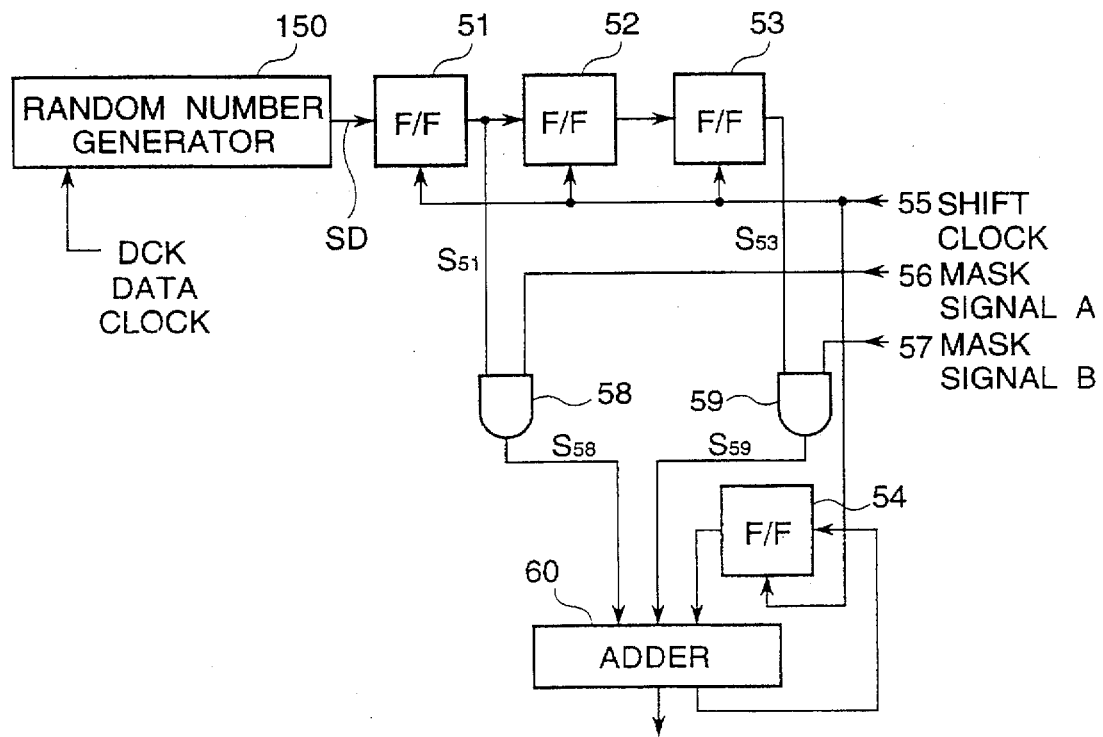
FIG. 3 is a block diagram of another conventional example of the background noise generating apparatus.
Figure 4:
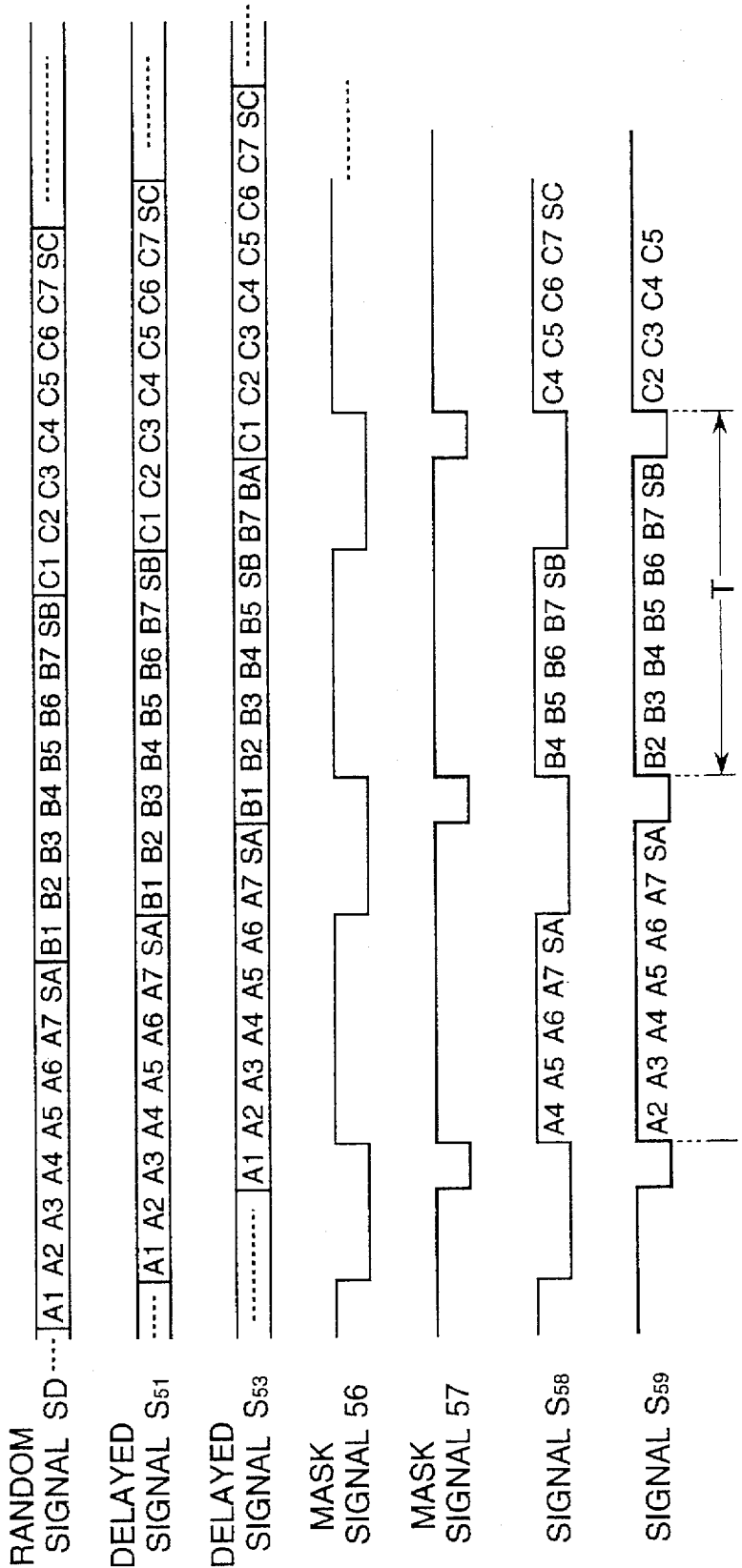
FIG. 4 is a timing chart illustrating an operation of the conventional example shown in FIG. 3.
Figure 5:
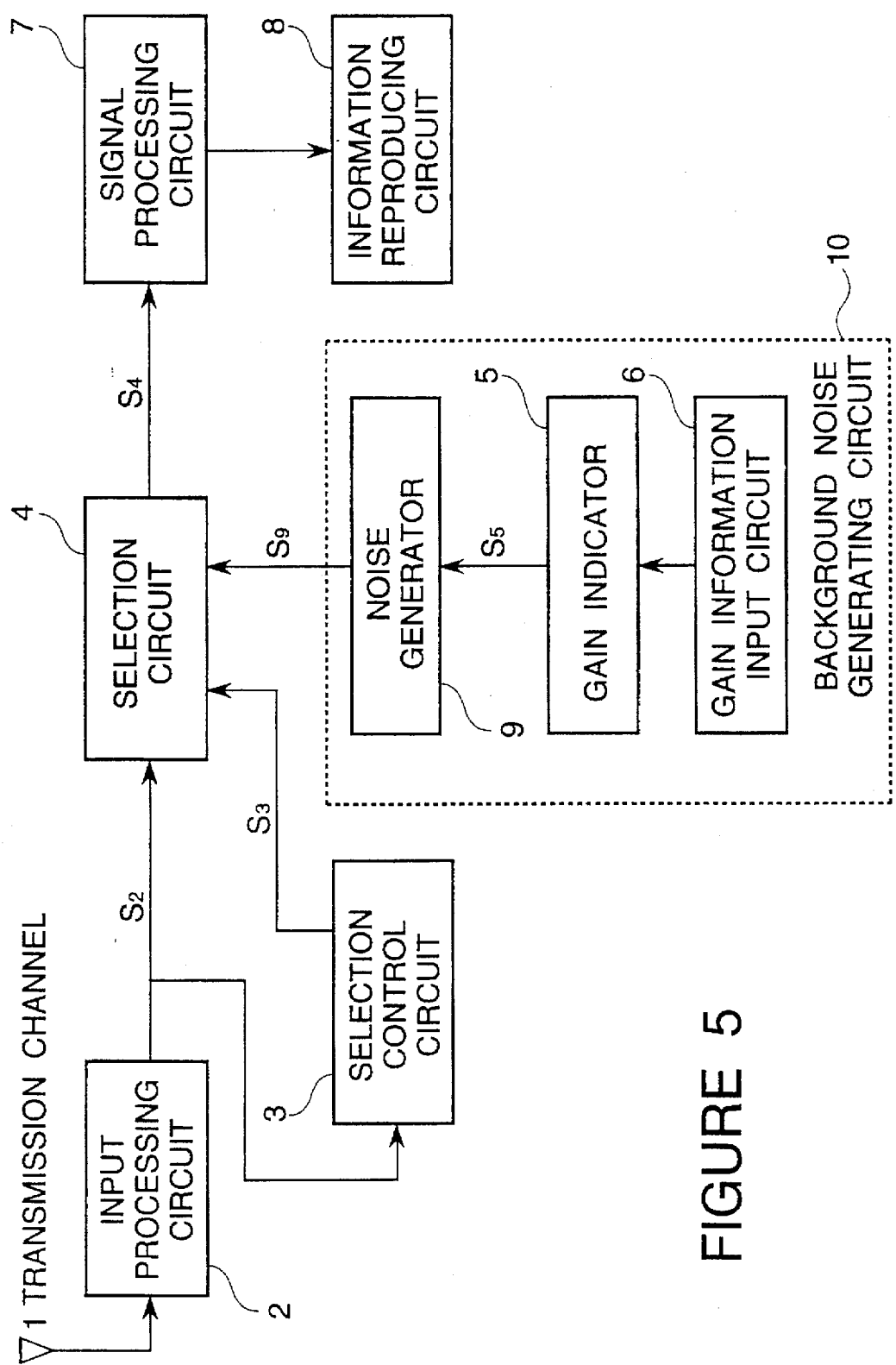
FIG. 5 is a block diagram of a first embodiment of the communication device incorporating therein the background noise generating apparatus in accordance with the present invention.

Referring to FIG. 5, there is shown a block diagram of a first embodiment of the communication device incorporating therein the background noise generating apparatus in accordance with the present invention.

In the system shown in FIG. 5, a transmission channel 1 is a predetermined transmission channel in a cable transmission or a RF transmission. A signal transmitted through the transmission channel 1 is supplied to an input processing circuit 2, which in turn performs a clock synchronization, a frame synchronization and a waveform shaping of the received data signal, so as to output a synchronized and shaped received data signal S2 to a selection control circuit 3. On the basis of the received data signal S2 from the input processing circuit 2, this selection control circuit 3 discriminates whether the received data is an encoded data of analog information to be transmitted, for example, an encoded data of an audio sound, or an encoded data of a reproduction indicating information on the basis of which an analog information is to be reproduced at a receiving side, for example, an encoded data indicating a no-sound period. On the basis of the result of the discrimination, the selection control circuit 3 outputs a selection control signal S3, which indicates either a signal reproducing period or a background noise period.

The received data signal S2 and the selection control signal S3 are supplied to a selection circuit 4, which also receives a background noise signal S9 from a background noise generating circuit 10. This background noise generating circuit 10 includes a noise generator 9 for generating the background noise signal S9 under control of a gain control signal S5 supplied from a gain indicator 5. The background noise generating circuit 10 also includes a gain information input circuit 6 receiving a setting gain value supplied from an external input (not shown) or anther control circuit (also not shown), so as to set the received setting gain value to the gain indicator 5, so that the gain indicator supplies the set gain value to the noise generator 9.

The selection circuit 4 selects either the received data signal S2 or the background noise signal S9 on the basis of the selection control signal S3.

In the shown embodiment, the gain indicator 5 is configured to receive the setting gain value from the gain information input circuit 6, and to generate, in the form of a binary code, a gain control signal S5 for adjusting the gain of the background noise data. This gain control signal S5 is outputted from the MSB bit in order.

An output signal S4 (either the received data signal S2 or the background noise signal S9) of the selection circuit 4 is supplied to a signal processing circuit 7, which in turn performs various signal processings required to reproduce the analog information transmitted. For example, the signal processing circuit 7 performs a digital filtering, a D/A conversion, an analog filtering, amplification, etc. An information reproducing circuit 8 reproduces an audio and/or image on the basis of the transmission data subjected to a predetermined decoding processing in the signal processing circuit 7.

Now, a construction of the noise generator 9 will be described with reference to FIG. 6, which is a logic circuit diagram of the noise generator 9 of the first embodiment shown in FIG. 5. FIG. 7 is a timing chart illustrating an operation of the noise generator 9 shown in FIG. 6.

The noise generator 9 includes a random number generator 21 receiving a frame clock FCK from a clock generator (not shown), for generating a random number data signal S21 in synchronism with the frame clock FCK. A logic gate 22 receives the random number data signal S21 and the gain control signal S5 supplied from the gain indicator 5, for outputting the result of a predetermined logic between the two received signals. In the shown embodiment, the logic gate 22 is an exclusive-OR. As shown in FIG. 5, the selection circuit 4 receives the output signal S9 of the exclusive-OR logic gate 22 and the received data signal S2 from the input processing circuit 2, and selectively outputs one of the two received signals in accordance with the selection control signal S3.

The random number generator 21 is constituted of for example a maximum sequence (M sequence) code generator, which artificially generates and serially outputs a random number taking "0" or "1" independently of each other in synchronism with the frame clock and for each frame period. Here, as shown in FIG. 8, this M sequence code generator can be constituted of a shift register formed of a plurality of cascaded flipflops FF1 to FF5, and a logic circuit receiving an output of predetermined ones of the cascaded flipflops FF1 to FF5, for feeding back the result of the logic between the received signals, to a first stage of the shift register (flipflop FF1). This M sequence code generator can generate a predetermined pattern of bit data by designing the feedback path and the logic of the logic circuit. In the case of an n-stage shift register, it is possible to periodically output a maximum sequence (M sequence) of a $(2^n-1)$ bit length.

The circuit shown in FIG. 8 shows the example of n=5, in which a feedback data is extracted from the third and fifth flipflops FF3 and FF5, and the two items of feedback data are supplied to a half adder A1, which takes a sum of modulo 2 and feeds back the result to the first flipflop FF1. Accordingly, the circuit shown in FIG. 8 outputs the M-sequence code in synchronism with the frame clock FCK supplied to the respective flipflops.

The M sequence code is so constituted that, of the $(2^n-1)$ data bits, "1"s of $2^{(n-1)}$ and "0"s of $2^{(n-1)}-1$ appear, or "0"s of $2^{(n-1)}$ and "1"s of $2^{(n-1)}-1$ appear, so that the difference between the number of "1"s and the number of "0"s is "1". Accordingly, the output of the M sequence code generator can be assumed to be a random number taking "1" or "0" with probability of "½", in a period shorter than the $2^{(n-1)}$ bit length. In the timing chart shown in FIG. 7, the signal S21 of the random number generator 21 changes in the order of "1", "0", "0", "1" at random for each frame.

The gain control signal S5 is a binary code indicative of a predetermined gain, serially outputted in synchronism with the data clock DCK. This code is outputted for each frame. In the shown embodiment, the code of the gain control signal S5 is "0000000000110010" in one frame, which is serially outputted from the MSB bit in synchronism with the data clock DCK. In the shown example, the right side is a LSB bit, and "0000000000110010" means a decimal number "50". The absolute value of the gain control signal S5 becomes a maximum value when all the 15 bits other than the MSB bit, which is a sign bit, are "1". Namely, the maximum value of the absolute value of the gain control signal S5 is $2^{15}$=32768. As a result, in the embodiment shown in FIG. 7, the gain control signal S5 can indicate "50/32768" as the value of the gain. Of course, the shown embodiment is such that the gain control signal S5 is not limited to a specific bit pattern, but can be set to take any value.

As mentioned above since the logic gate 22 outputs the exclusive-OR between the gain control signal S5 and the random number data signal S21, the background noise data signal S9 becomes consistent with the gain control signal S5 in a frame in which the random number data is "0" and becomes an inverted signal of the gain control signal S5 in a frame in which the random number data is "1". As will become apparent from a description made hereinafter, even if the logic gate 22 is an exclusive-NOR, the background noise generating circuit 10 can perform the same operation. In addition, the logic gate 22 can be constructed of an inverter and a transfer gate connected in parallel to each other, and either the inverter or the transfer gate is selected in accordance with the signal S21, so that the signal S5 is outputted through the selected one of the inverter and the transfer gate.

Incidentally, the binary code used in various signals including the received data signal and the random number output data, is based on the code system shown in FIG. 9. Namely, in each binary code, the MSB bit is a sign bit, which is positive when it is "0" and negative when it is "1". The code composed of all bits of "0" indicates "0" in decimal number, and the binary code indicates sequentially a positive number of 1 and succeeding integers at each time the binary code is incremented by "1". On the other hand, the binary code composed of all bits of "1" indicates "−1" in decimal number, and the binary code shows sequentially a negative number of −2 and succeeding integers at each time the binary code is decremented by "1".

Therefore, the value represented by a code obtained by inverting all the bits of the gain control signal S5 is equal to a value obtained by inverting the sign of the value represented by the gain control signal S5 and by incrementing the absolute value of the value by "1". Namely, in the example shown in FIG. 7, the value represented by the inverted code becomes −51/32768. Accordingly, the gain set in the background noise data signal S9 outputted from the logic gate 22 becomes +50/32768 and −51/32768.

In the shown embodiment, furthermore, the MSB bit of the binary code is a sign bit, but it is so constructed that the sign of the background noise, which is supplied as the output signal, is determined by the M-sequence random number value. Therefore, in order to ensure that the MSB bit gives no influence to a random property of the M-sequence code, the MSB bit of the gain control signal S5 is fixed to a high level or a low level. In the example shown in FIG. 6, the MSB bit of the gain control signal S5 is fixed to the low level.

As seen from the above description, in the circuit shown in FIG. 6, the gain of the background noise data signal S9 is set to ±(50.5)/32768 −(½)/32768. Here, −(½)/32768 is an offset. However, since −(½)/32768 is a half of the gain indicated by the LSB bit of the gain control signal, namely a half of (1/32768), this offset does not vary the gain to be set, to another set value, and therefore, a malfunction is never caused.

In addition, since this offset value is as small as a half of the value (1/32768) indicated by the LSB bit of the gain control signal, the offset value is an error of a magnitude similar to a quantization error at the time of converting an analog data such as an audio or an image into a transmission data. Therefore, the offset value is of the magnitude which can be regarded as being a portion of the background noise.

In the circuit of the present embodiment, the absolute value of the values indicated by the background noise data signal S9 are only two values, namely, "50" and "51". In addition, if the difference between these two values is considered to be an offset, the absolute value of the values indicated by the background noise data signal S9 can be considered to be only "50.5". However, since the sign of the value indicated by the background noise data signal S9 varies at random, a noise reproduced in the signal processing circuit 7 on the basis of the background noise data signal S9 has a sufficiently wide frequency band, and therefore, can be used as a background noise.

Thus, the circuit of the shown embodiment can set an arbitrary gain for the background noise data signal S9, and can simplify the circuit construction. In particular, since the latch circuit which was necessary for setting the gain in the prior art, becomes unnecessary, the circuit area is remarkably reduced, and the consumed electric power can be reduced. In addition, the shown embodiment is so configured that since an arbitrary numerical value to be set is used as the gain setting code, it is possible not only to set the gain at a desired precision, but also to make it easy to generate and supply the signals required for setting the gain and to set the gain itself. Therefore, the circuit for generating and supplying the signals required for setting the gain and the circuit for setting the gain can be simplified in circuit construction, respectively. In addition, since the random number generator 21 is sufficient if it generates the random number in synchronism with the frame clock FCK, the flipflops FF1 to FF5 in the random number code generator shown in FIG. 8 can operate at a low speed. Therefore, reliability of the operation can be elevated, and the consumed electric power can be reduced.

Figure 10:
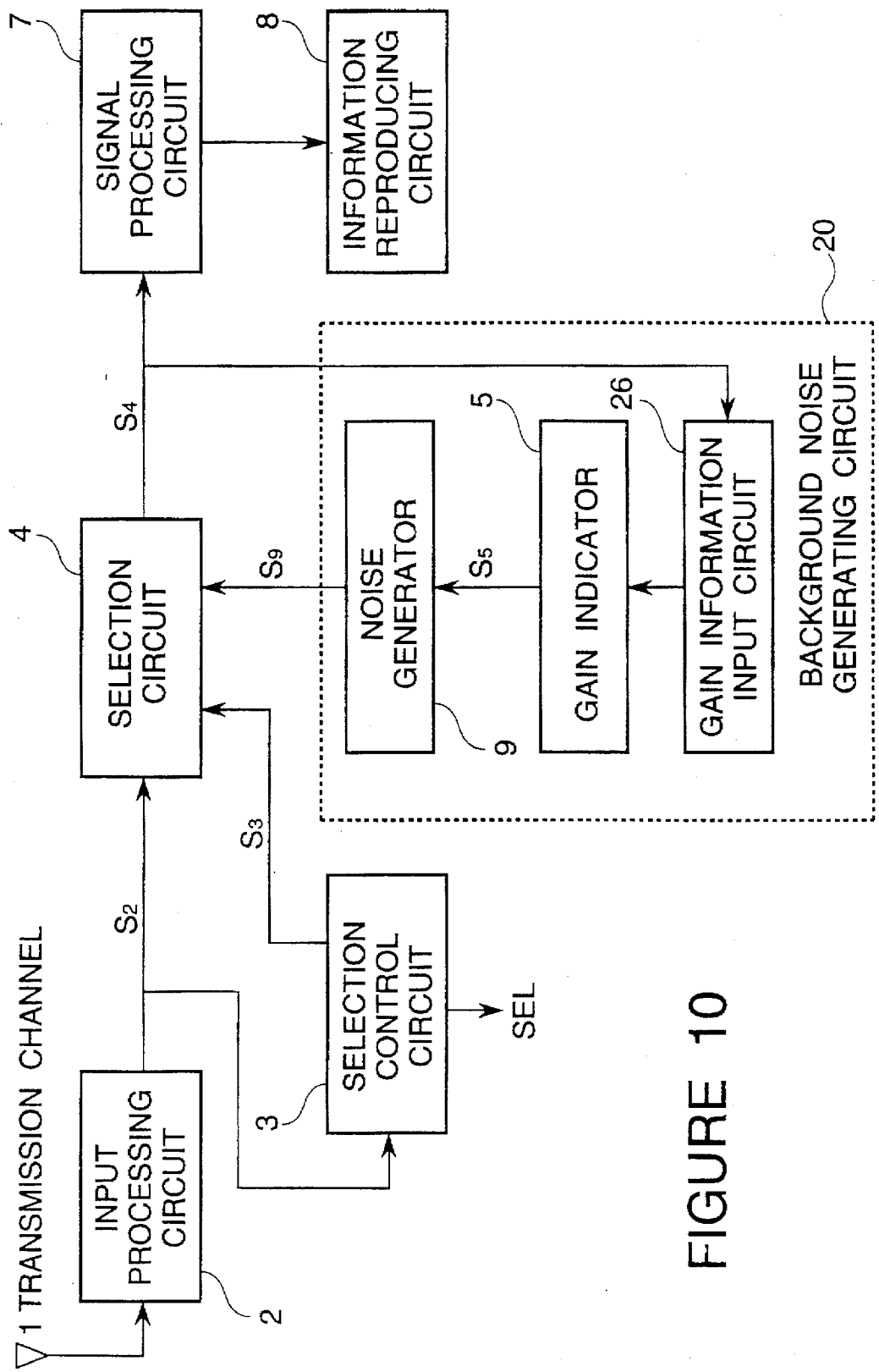
FIG. 10 is a block diagram of a second embodiment of the communication device incorporating therein the background noise generating apparatus in accordance with the present invention.

Referring to FIG. 10, there is shown a block diagram of a second embodiment of the communication device incorporating therein the background noise generating apparatus in accordance with the present invention. In FIG. 10, elements similar to those shown in FIG. 5 are given the same Reference Numerals, and explanation thereof will be omitted for simplification of the description.

The second embodiment is different from the first embodiment in that the output signal S4 of the selection circuit 4 is applied to a gain information input circuit 26 in a background noise generating circuit 20, so that the gain information input circuit 26 detects the level of the output signal S4 and determines the gain to be set for the background noise signal.

Figure 11:
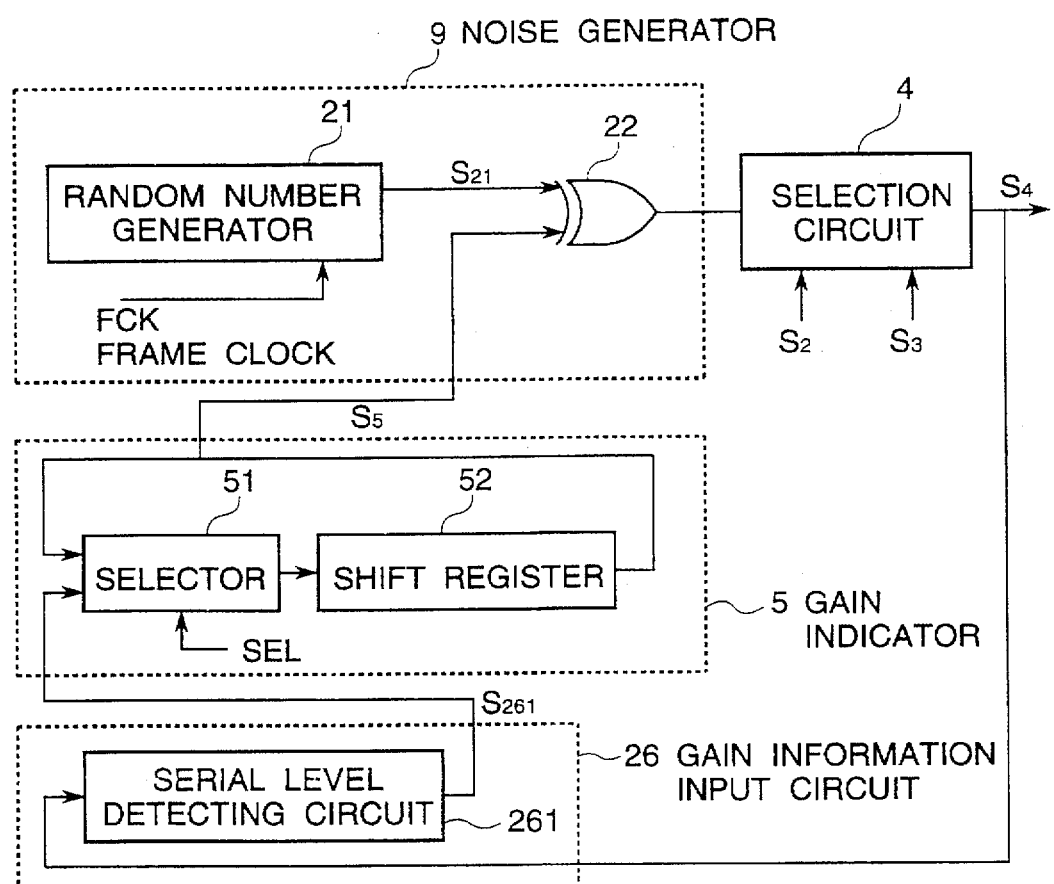
FIG. 11 is a logic circuit diagram of the background noise generating circuit of the second embodiment shown in FIG. 10.

Referring to FIG. 11, there is shown a logic circuit diagram of the background noise generating circuit 20 of the second embodiment shown in FIG. 10.

The background noise generating circuit 20 includes a serial level detecting circuit 261 serially receiving the output signal S4 of the selection circuit 4. This serial level detecting circuit 261 is configured to detect the level of the signal S4, and to generate a code signal S261 determined in accordance with the level of the signal S4. The code signal S261 is supplied to a first input of a selector 51 of the gain indicator 5. This selector 51 has an output connected to a shifter register 52, and a second input connected to receive an output signal of the shift register 52, which constitutes the gain control signal S5 outputted from the gain indicator 5. The selector 51 is controlled by a control signal SEL supplied from the selection control circuit 3, so as to select either the code signal S261 or the output signal S5 to supply or feed back the selected signal to the shifter register 52.

This circuit operates as follows: During a frame period corresponding to an ordinary signal reproducing period, similarly to the embodiment shown in FIG. 5, the selection circuit 4 is controlled by the signal S3 so as to select the received data signal S2 from the input processing circuit 2, and to output the selected signal as the output signal S4. In response to the selected signal S4, the signal processing circuit 7 and the reproducing circuit 8 reproduce the received data. At this time, the serial level detecting circuit 261 detects the level of the output signal S4 as mentioned above, and generates the code signal S261 in accordance with an averaged level of the output signal S4. This code signal S261 is supplied to the selector 51. During a frame or frames of this signal reproducing period, the selector 51 is controlled by the control signal SEL to select the code signal S261 from the serial level detecting circuit 261 and to supply the selected code signal S261 to the shift register 52. Thus, the data held in the shift register 52 is updated in accordance with the level of the output signal S4.

On the other hand, during a background noise period, the selection control circuit 3 changes the level of each of the output signal 3 and the control signal SEL. In response to this control signal SEL, the selector 51 selects the output signal S5 of the shift register 52. Namely, the supply of the code signal S261 from the serial level detecting circuit 261 is blocked, the shift register 52 continues to hold the data held at the moment the code signal S261 was blocked. In other words, the shift register 52 continues to hold the code corresponding to the level of the output signal S4 just before the code signal S261 was blocked. The output signal of the shifter register 52 continues to be supplied to the noise generator 9 as the gain control signal S5 outputted from the gain indicator 5. Similarly to the first embodiment, the noise generator 9 generates the background noise signal S9 having the gain in accordance with the gain control signal S5 In this frame, since the selection control circuit 3 causes the selection circuit 4 to select the background noise signal S9 from the noise generator 9, the background noise signal S9 is supplied as the output signal S4 of the selection circuit 4, and the signal processing circuit 7 and the reproducing circuit 8 reproduce the background noise.

When the ordinary signal reproducing period starts again, the selection circuit 4 selects again the output signal S2 of the input processing circuit 2, which is the received signal, and the selector 51 selects again the code signal S261 from the serial level detecting circuit 261, in accordance with the control signal SEL. Accordingly, the shift register 52 receives and holds the code indicating the gain which corresponds to the level of the output signal S4.

In this second embodiment, therefore, when the ordinary signal reproducing period is switched to the background noise period, the level of the just preceding signal S4, namely, the code determined by detecting the level of the received signal, is held, and the gain control signal corresponding to this held code is outputted during the background noise period, so that the gain of the background noise is set. Accordingly, more precise gain adjustment can be realized.

In this second embodiment, furthermore, since it is possible to set an arbitrary gain value for the gain control signal S5, it is possible to use the code indicating the level detected and determined by the serial level detecting circuit 261, as the gain control signal, without modification. Therefore, the circuit construction of the gain indicator can be made extremely simple.

In the second embodiment, the code held when the ordinary signal reproducing period is switched to the background noise period, is determined on the basis of the level of the signal S4 during a just preceding frame period. As mentioned hereinbefore, in the case of transmitting an analog signal such as an audio variation of the the level of the analog signal is small during a lapse of the time period of one frame. Therefore, it can be deemed that, just before the ordinary signal reproducing period is switched to the background noise period, the analog amount such as an audio level to be transmitted has already attenuated to a considerably low level. Accordingly, if the code corresponding to the level of the signal S4 during the just preceding frame period is generated and the gain is adjusted on the basis of the code thus generated, the obtained background signal is equivalent to a signal which would be obtained by extracting and reproducing the noise included in the ordinary signal reproducing period.

As seen from the above, the background noise generating circuit in accordance with the present invention can easily set the gain of the background noise with a data bit precision, and also can reduce the circuit construction for setting an arbitrary gain other than the power of 2. Therefore, a circuit having a high precision and a small size can be realized.

Since an arbitrary numerical value to be set is used as the gain setting code, it is possible not only to set the gain at a desired precision, but also to make easy generation and supply of signals required for setting the gain and the gain setting itself. Therefore, the circuit for generating and supplying the signals required for setting the gain and the circuit for setting the gain can be simplified in circuit construction, respectively.

Furthermore, in the case of automatically setting the gain, it is possible to output the value of the gain immediately after the value of the gain to be set is determined for example by monitoring the output signal. Therefore, for the gain setting, it is no longer necessary to generate a special signal such as a bit modifying mask signal, and accordingly, it is also possible to remarkably simplify the construction of the circuit for indicating the gain setting value.

In addition, since the random number generator is sufficient if it generates the random number in synchronism with the frame clock for the transmission data, the random number code generator can operate at a speed which is greatly lower than the data signal. Therefore, reliability of the operation can be elevated, and the consumed electric power can be reduced.

The invention has thus been shown and described with reference to the specific embodiments. However, it should be noted that the present invention is in no way limited to the details of the illustrated structures but changes and modifications may be made within the scope of the appended claims.

I claim:

1. A background noise generating apparatus comprising:

a first input circuit for receiving a level control information;

a level control circuit receiving an output of said first input circuit and controlled by a first clock so as to output a level control signal in accordance with said output of said first input circuit;

a random number generator receiving a second clock different from said first clock, for generating a random data;

a logic gate receiving said random data and said level control signal during a first period in accordance with said second clock, for generating a predetermined logic value signal;

a selection controller, receiving said second clock, for outputting a predetermined selection control signal in synchronism with said second clock; and a selection circuit for receiving said logic value signal outputted from said logic gate, for selectively supplying said logic value signal of said logic gate during said first period in accordance with said selection control signal from said selection controller.

2. A background noise generating apparatus claimed in claim 1, wherein said first clock has a period shorter than that of said second clock.

3. A background noise generating apparatus claimed in claim 1, wherein said logic gate comprises an exclusive-OR gate for receiving said random data and said level control signal.

4. A background noise generating apparatus claimed in claim 1, further including a second input circuit for receiving a predetermined input signal in response to said first clock, and a signal processing circuit for receiving an output signal outputted from said selection circuit, said selection circuit also for receiving an output signal outputted from said second input circuit, said selection circuit being controlled in accordance with said selection control signal, so as to selectively supply said output signal outputted from said second input circuit, to said signal processing circuit during a second period different from said first period.

5. A background noise generating apparatus claimed in claim 4, wherein said output of said second input circuit is serially outputted in response to said first clock, and said level control signal of said level control circuit is also serially outputted in response to said first clock, and wherein said random data of said random number generator is serially outputted in response to said second clock.

6. A background noise generating apparatus claimed in claim 1, wherein said level control circuit includes:

a detection circuit, connected to said output of said selection circuit, for detecting said level of said output signal of said selection circuit during said second period, so as to generate said level control signal in accordance with said detected level of said output signal of said selection circuit, said level control signal being supplied to said first input circuit.

7. A background noise generating apparatus claimed in claim wherein said level control circuit includes:

a level control signal generating circuit for generating said level control signal in accordance with said output of said first input circuit; and a holding circuit for holding and outputting said level control signal generated in said level control signal generating circuit, during said first period in accordance with said second clock.

* * * * *